United States Patent
Shen et al.

(10) Patent No.: US 8,462,822 B2
(45) Date of Patent: Jun. 11, 2013

(54) METHOD OF AND PHOTONIC DEVICE FOR ELIMINATING OR SUBSTANTIALLY REDUCING SENSITIVITY TO POLARIZATION OF AN INJECTED OPTICAL SIGNAL AND METHOD OF MANUFACTURING SUCH PHOTONIC DEVICE

(75) Inventors: Alexandre Shen, Palaiseau (FR); Guang-Hua Duan, Palaiseau (FR)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/317,933

(22) Filed: Nov. 1, 2011

(65) Prior Publication Data

US 2012/0044961 A1   Feb. 23, 2012

Related U.S. Application Data

(62) Division of application No. 12/458,504, filed on Jul. 14, 2009, now Pat. No. 8,130,801.

(30) Foreign Application Priority Data

Jul. 18, 2008   (EP) ..................................... 08013004

(51) Int. Cl.
*H01S 3/098* (2006.01)
(52) U.S. Cl.
USPC ..................... 372/18; 372/45.01; 372/45.011; 372/45.013; 372/44.01
(58) Field of Classification Search
USPC ............ 372/18, 45.01, 45.011, 45.013, 44.01
See application file for complete search history.

(56) References Cited

U.S. PATENT DOCUMENTS

| | | | |
|---|---|---|---|
| 5,068,749 A | 11/1991 | Patel | |
| 5,117,469 A * | 5/1992 | Cheung et al. | 385/11 |
| 5,647,029 A | 7/1997 | Mihailidi et al. | |
| 5,724,463 A | 3/1998 | Deacon et al. | |
| 5,881,086 A | 3/1999 | Miyazawa | |
| 6,026,107 A * | 2/2000 | Huang | 372/50.1 |
| 6,288,410 B1 | 9/2001 | Miyazawa | |
| 2004/0096175 A1 * | 5/2004 | Tolstikhin | 385/131 |
| 2004/0184491 A1 | 9/2004 | Wai et al. | |

OTHER PUBLICATIONS

European Search Report dated Dec. 5, 2008.
Horer J et al: "Optimization of the Optical Switching Characteristics of Two-Section Fabry-Perot Lasers" IEEE Photonics Technology Letters, IEEE Service Center, Piscataway, NJ, US, vol. 5, No. 11, Nov. 1, 1993.

* cited by examiner

*Primary Examiner* — Kinam Park
(74) *Attorney, Agent, or Firm* — Harness, Dickey & Pierce, P.L.C.

(57) ABSTRACT

An photonic device, comprising one section of a material which is different from the material of another section such that the two sections present different optical birefringent index values. This causes a first set of polarization modes to move in a spectral space with a different velocity than a second set of polarization modes. A bias current, or voltage, is used for controlling the overall birefringence effect in the device. The biasing for controlling the birefringence effect is performed such the TE modes and the TM modes of the device are made to coincide in their respective spectral position. Thus the device is made insensitive, or presents substantially reduced sensitivity, to the polarization of any incoming optical signal.

4 Claims, 3 Drawing Sheets

METHOD OF AND PHOTONIC DEVICE FOR ELIMINATING OR SUBSTANTIALLY REDUCING SENSITIVITY TO POLARIZATION OF AN INJECTED OPTICAL SIGNAL AND METHOD OF MANUFACTURING SUCH PHOTONIC DEVICE

This application is a divisional of U.S. application Ser. No. 12/458,504 filed Jul. 14, 2009, now U.S. Pat. No. 8,130,801 which claims priority on European Patent Application No. 08013004.0 filed Jul. 18, 2008. The entire contents of all of these applications are incorporated herein by reference.

The present invention relates to photonic devices such as, but not limited to, injection-locked laser diodes, optical filters, interferometers and the like.

BACKGROUND OF THE INVENTION

Photonic devices are widely used in optical transmission and optical networks. Certain photonic devices operate by being locked to an injected optical signal in order to select one wavelength and/or to ensure stability such as for example providing a constant output frequency. In such conditions, the photonic device may exhibit one or two sets of polarization modes in its transmission or reflection spectra, corresponding to transverse electric (TE) mode and/or transverse magnetic (TM) mode. Therefore, the injection-locking of these devices depends on the state of the polarization of the incoming optical signal, even when the devices exhibit two polarization modes in their spectra.

One example of such devices are the injection-locked laser diodes which are being increasingly used in fiber to the home (FTTH) access networks as an ONU (Optical Network Unit). These laser diodes typically operate on transverse electrical (TE) mode.

DESCRIPTION OF THE INVENTION

It is to be noted that throughout this description, any reference to insensitivity to polarization, such as the terms "polarization insensitive" is understood to encompass either complete insensitivity or negligible sensitivity to polarization. As it is clearly understandable by a person skilled in the related art, real devices may not achieve the status of complete, or absolute, insensitivity to polarization as they may not operate under ideal conditions, thus some level of sensitivity may always exist although such level may be substantially low such that in practice it may be considered as negligible. Therefore, a level of sensitivity which is considered negligible for practical purposes, is also to be understood as being encompassed within the scope of the terminology used in this description for insensitivity and therefore within the scope of the present invention. Such negligible levels of sensitivity may be defined by a skilled person depending on the photonic device in use. For example, in case of an injection-locked laser diode, it may be conventionally defined that polarization insensitivity (PI) is attained when the second mode suppression rate (SMSR) varies less than 1 dB in the injection-locked laser emission spectrum when the polarization of the injection-locking signal is varied from 0° to 180° from its initial polarization.

Considering the example of a known photonic device, such as for example a Fabry-Perot laser diode (FPLD), in order for such device to become polarization insensitive, an ASE from high output power fiber amplifiers, typically as high as 30 dBm, is usually needed in order to injection-lock the FPLD in the ONU. ASE typically contains TE components, which lock the photonic device. However, the ASE sources are usually very large in spectrum, therefore they have to be filtered by using typically an AWG (Arrayed Waveguide Grating) which acts as a multiplexer. Therefore, only a fraction of the initial 30 dBm power is transmitted to the dedicated ONU, this fraction of power is centered at one of the (typically ITU-compliant) grid channels and the ONU is required to be locked to that (ITU-compliant) frequency (or equivalently its wavelength).

Injection-locking occurs only when high power EDFA is used in order to compensate for losses in demultiplexing. The following is a brief example to explain this requirement in further detail Assuming a commercially available AWG with 40 channels is used, corresponding to 40 ONUs to be addressed, spaced at 100 GHz, with a 12.5 GHz bandwidth and 5 dB insertion loss per channel, the sliced power from a 30 dBm EDFA is less than 0 dBm, after filtering. This amount of power (0 dBm) has to undergo propagation in fiber and connection losses before reaching the ONU. A power budget of −8 dBm is typically available for 40 km short reach access systems, and the budget drops to −16 dBm for 80 km reach.

Another problem is that, a propagation system which is required to transport 30 dBm optical power before the demultiplexing node may become highly hazardous for human eye security. In order to avoid such hazards, this portion of fiber system is typically made of class A graded fiber system, which implies to use relatively expensive hardware, and to apply heavier maintenance norms.

In contrast, by using a coherent optical source such as a laser diode instead of a sliced white source (EDFA followed by an AWG), a 5 dBm coherent optical power emitted at the central office will still have 0 dBm power budget after being selected by the AWG. Even if 40 of such coherent sources are accumulated, the total amount of power is only 21 dBm compared to the 30 dBm in the case of incoherent sources. This causes a saving of about 9 dB power budget which can bring the level of security required for the propagation system from grade A to grade B which is less expensive, thus giving rise to capital expenditure savings for the operator, or for any access provider in general.

However, one of the drawback associated to the coherent injection scheme is that the photonic component in the ONU becomes highly polarization sensitive.

Bulk materials are available which are optimized for PI semiconductor optical amplifiers. However, a PI optical gain in the known devices is not sufficient to achieve PI injection-locking, because of the effect of optical birefringence produced by the semiconductor material. This effect causes the transverse electrical (TE) mode optical index to be different from the transverse magnetic (TM) optical index. As a consequence, the TE mode spectral positions are usually different from those of the TM modes. As a result of such difference in the respective optical indices of the two modes, the optical emission spectra from the photonic devices present, in general, two spectral combs which are not superposed, thus causing sensitivity to polarization.

Embodiments of the invention relate an injection-locked photonic device, comprising at least two sections, one of said at least two sections being of a different material than the material of the other one of said at least two sections such that said at least two sections present different optical birefringent index values, thereby in response to an injected optical signal causing a first set of polarization modes to move in a spectral space with a different velocity than a second set of polarization modes.

In some specific embodiments of the invention the photonic device may be an FPLD or a an optical filter, or an interferometer. Such device may comprise at least two sections comprise one section comprising an optimized PI-gain material, and another section comprising a birefringence optimized passive material so that a total birefringence generated in the laser cavity is reduced to null, or is reduced substantially. In this manner a TE mode of the optical signal is made to coincide with TM mode thus allowing to achieve a polarization insensitive IL-LD suitable for access applications.

In some embodiments there is provided a method of manufacturing an injection-locked photonic device, comprising the steps of growing at least one first section and at least one second section wherein the material of the at least one first section is different from the material of the at least one second section such that said first and second sections present different optical birefringent index values, thereby in response to an injected optical signal causing a first set of polarization modes to move in a spectral space with a different velocity than a second set of polarization modes.

In some specific embodiments of the invention where the photonic device is an FPLD or a an optical filter, or an interferometer, the method may comprise the steps of growing an optimized PI-gain material in the first section, and growing a birefringence optimized passive material in the second section so that a total birefringence generated in the laser cavity is reduced to null, or is reduced substantially.

In some embodiments of the invention there is provided a method of reducing sensitivity to polarization in an injection-locked photonic device, comprising at least two sections, one of said at least two sections being of a different material than the material of the other one of said at least two sections such that said at least two sections present different optical birefringent index values, thereby in response to an injected optical signal causing a first set of polarization modes to move in a spectral space with a different velocity than a second set of polarization modes, the method comprising the steps of biasing the first section with an electrical current for obtaining an optical gain and biasing the second section with a current or a voltage for controlling a birefringence effect wherein said biasing of current or voltage for controlling the birefringence effect is made such that TE modes and TM modes in the device are made to coincide in their respective spectral position.

These and further features and advantages of the present invention are described in more detail in the following description as well as in the claims with the aid of the accompanying drawings.

EXAMPLES OF PREFERRED EMBODIMENTS

In the following example of embodiment, reference is made to FPLDs. However, it is to be noted that the invention is not limited to such embodiment and other photonic devices such as optical filters and interferometers are also to be considered to be within the scope of protection of the invention as claimed herein.

As already discussed above in relation to conventional FPLDs, due to the effect of optical birefringence produced by the semiconductor material, the transverse electrical (TE) mode optical index is different from the transverse magnetic (TM) mode optical index and thus the TE mode spectral positions are usually different from those of the TM modes which causes the optical emission spectra from FPLDs to present, in general, two sets of polarization modes (TE and TM) which in most cases are not superposed.

In a common photonic waveguide, as known by those skilled in the art, there exist two transverse eigen modes for any electro-magnetic fields (EMF) which are allowed to propagate through it. The polarization state of the EMF in the waveguide is either TE or TM, and these two eigen states are orthogonal. The transmission, reflection or laser emission spectra showing TE modes, TM modes or both of them are due to the total structure of the waveguide inside the cavity (filter, interferometer or FP laser), be it made of one, two or many more sections, provided that any sub-cavity is suppressed by careful engineering (elimination of parasitic internal reflections on the interfaces of the different sections).

In the case where the device allows both TE and TM modes, if one set of polarization modes corresponds to TE (or TM) modes, then the second one will correspond to the orthogonal TM (or TE) modes. Any polarized signal (injection locking signal in case of FP IL-LD, signal to be filtered in case of filter, and signal to be analyzed in case of an interferometer) being input into the device can be geometrically projected onto both eigen modes (TE & TM) at a given wavelength: that is why the eigen modes of the said photonic device (IL-LD, filter or interferometer) have to be at the same spectral position (the TE and TM modes have to coincide on the emission, reflection or transmission spectra).

Figure 1:
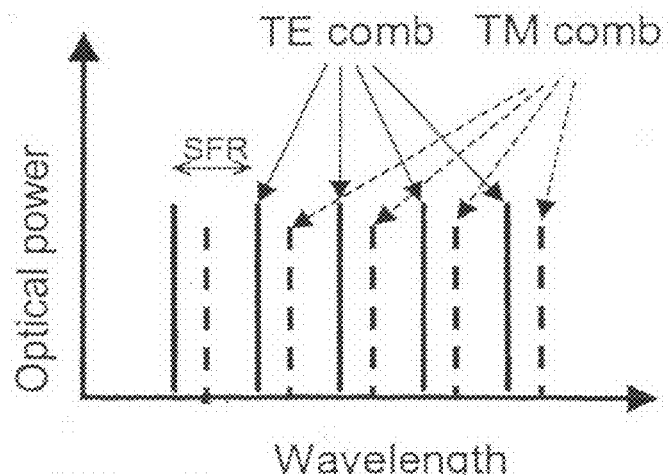
FIG. 1 is a schematic exemplary representation of an optical spectral comb with TE modes and TM modes generated by a conventional FPLD with a PI gain.

This effect is schematically shown in FIG. 1 which represents an optical spectrum from a conventional FPLD where the active layer gain is PI-optimized however the bireferingent index dispersion is not optimized. In the figure, the X-axis represents wavelength and the Y-axis represents the optical power. The X and Y axes are not marked with units because this figure is intended to be a mere schematic representation of the spectral combs of the TE and the TM modes for a simplified understanding of the difference in their respective spectral positions. The TE mode comb is represented by solid lines and the TM mode comb is represented by broken lines. As it can be clearly seen in the figure, the TE and the TM combs are separated from each other by about a half of a free spectral range (FSR). It is therefore this separation in their spectral positions that causes polarization sensitivity. Also as it is schematically represented in FIG. 1, the TE modes have higher levels of optical power as compared to the TM combs which is mainly due to the fact that the effective gain in the laser cavity remains polarization dependent in general cases.

Figure 2:
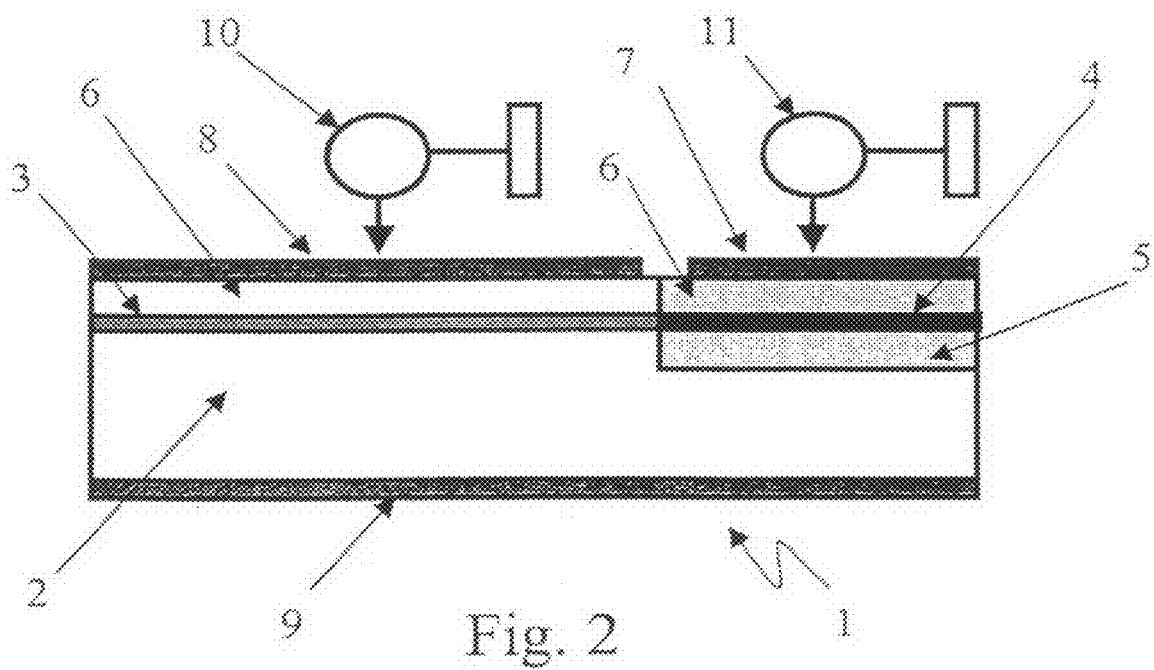
FIG. 2 is a simplified schematic cross-section representation of an FPLD according to some embodiments of the invention.

FIG. 2 is a simplified schematic partial cross-section of an FPLD 1 according to some embodiments of the invention. On the substrate part 2, which is of any convenient material such as n doped InP substrate, a structure 3 of an optimized PI gain material is grown. This structure 3 will be described in further detail in relation to FIG. 3. The growth process of the structure 3 on the substrate 2 may be performed using conventional methods such as MOVPE (Metalorganic vapor phase epitaxy) growth or MBE (Molecular Beam Epitaxy) growth. The PI gain structure 3 is preferably bulk tensile strained thereby allowing to achieve PI gain over a wide spectral range (in fact with the right amount of strain, a material can be made PI gain (i.e. the TE gain having the same value as the TM gain). The growth process of the material is preferably performed over the entire surface of the substrate 2.

Next, the grown PI gain structure 3 is partially etched in predetermined regions thereof so as to partially remove the PI gain material. Said predetermined etched regions, i.e. free of PI gain material, are used for growing a structure of an optimized birefringence passive material 4 (for simplicity hereinafter referred to "passive material"). The etched region is schematically shown in FIG. 2 by the dotted area identified by reference numeral 5.

The passive material structure 4 may be grown on the etched regions of the substrate 2 using conventional methods such as MOVPE (Metalorganic vapor phase epitaxy) or MBE re-growth using an example of stacked layers as will be described in further detail in relation to FIG. 4.

In this manner, the FPLD is provided with an active section comprising the polarization-insensitive gain material 3 and a passive section comprising the birefringence passive material 4. In this example, the active section and the passive section are positioned adjacent to each other, however other dispositions are also possible.

The resulting structure is then completed with subsequent steps required for completing the device, such as a further step of growth of a layer 6 of p doped InP so that the etched trenches are flatly filled, a contact layer of highly doped InGaAs and InGaAsP contact layers covering the whole structure. In practice, a common contact layer covering both sections is grown, which is made of InGaAs and InGaAsP highly doped contact layers, however, these are included in layer 6 in the drawing of FIG. 2 for simplicity. The interelectrode zone of this contact layer is etched away and ions are implanted therein so as to provide efficient electrical isolation between electrodes. Electrical contact layers, or electrodes, 7, 8 and 9, are provided where one electrical contact layer 7 is located over the passive section corresponding to the birefringence passive material 4 and another electrical contact layer 8 is located over the active section corresponding to the polarization-insensitive gain material 3. The third contact layer 9, is used for common ground connection. In this manner, the contact layer 8 may be connected to a current source 10 in order to provide a bias current for the active section, and contact layer 7 may be connected to a current source 11 in order to provide a bias current for the passive section.

With two separated bias currents which may be different from each other and independently controlled, the active section may be biased with appropriate current so as to provide a desirable optical gain, and the passive regions may be biased with a respective appropriate current in order to control the birefringence effect in the device and thereby cancel, or substantially reduce the difference between the TE mode index and the TM mode index, thus making the two modes coincide as much as possible.

Figure 3:
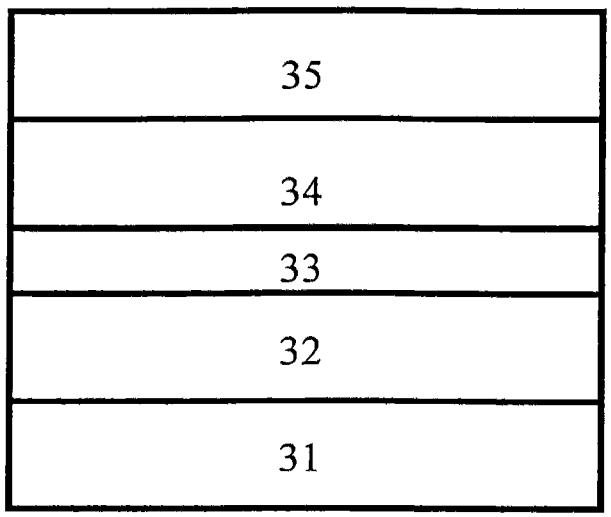
FIG. 3 is a schematic exemplary representation of layers of a structure of an active section with polarization insensitive gain material according to some embodiments of the invention.

FIG. 3 shows in further detail an exemplary structure of the PI gain material 3. Said structure is preferably bulk tensile strained, which allows for achieving PI gain over a relatively wide spectral range, typically in the C band (1530 nm-1565 nm).

As seen in the example of FIG. 3, the structure of the PI gain material 3 may comprise a buffer layer 31 typically made of InP material; a layer 32 typically made of InGaAsP 1.17 separate confinement hetero (SCH) layer (optical confinement layer) with a thickness in the range of, but not limited to 200 nm; a layer 33 of active gain material typically made of InGaAsP 1.55 bulk with −0.14% strain with a thickness in the range of, but not limited to 120 nm; a second SCH layer 34 typically made of strained InGaAsP 1.17 with a thickness in the range of, but not limited to 200 nm; and a top layer 35 of InP with a thickness in the range of, but not limited to 200 nm. The given layer thicknesses are preferred values because they provide effective PI gain when 1 μm wide waveguides are used, the gain dichroism may be corrected by the waveguide structure dichroism, a dichroism being polarization sensitivity in gain, loss or transmittance in a given material.

Figure 4:
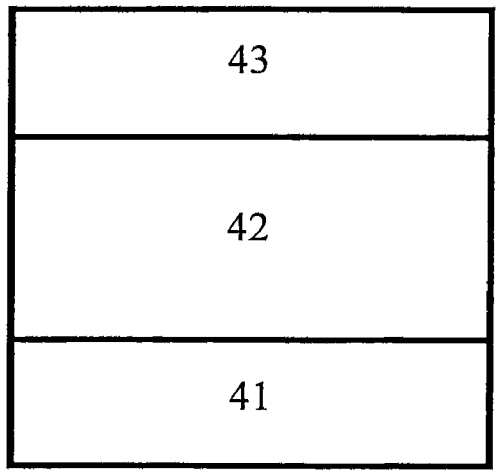
FIG. 4 is a schematic exemplary representation of layers of a structure of a passive section with birefringence passive material according to some embodiments of the invention.

FIG. 4 shows in further detail an exemplary structure of the passive material 4. This material is preferably made of a compressively strained bulk structure, which allows to achieve large birefringence.

As shown in the example of FIG. 4, the passive material may be a stacked structure with an adjusting layer 41 made of InP:Be (with Be dopant concentration of $1\times10^{18}$ cm$^{-3}$); an InGaAsP 1.45 bulk layer 42 (with a strain of +0.1% in lattice mismatching with a thickness of about but not limited to 420 nm; and a top layer 43 of InP:Si (Si dopant concentration of $1\times10^{18}$ cm$^{-3}$) with a thickness of about but not limited to 250 nm.

As mentioned above, the current biased into this passive section allows for adjusting the birefringence, so that TE and TM modes coincide.

Figure 5:
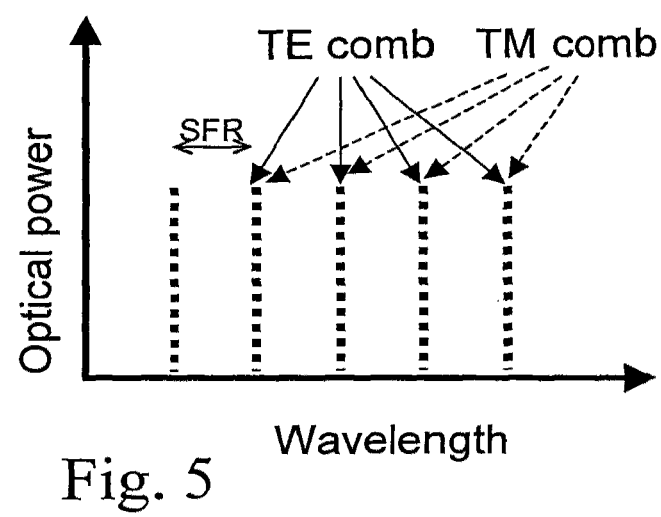
FIG. 5 is a schematic exemplary representation of an optical spectral comb with TE modes and TM modes generated in an FPLD which implements embodiments of the present invention.

This effect is schematically shown in FIG. 5. In this figure, in similar fashion as in FIG. 1, an optical spectrum is represented from an FPLD in terms of optical power as a function of wavelength (without marking units on the X and Y axes). However, in FIG. 5 an optical spectrum is schematically represented from an FPLD that has an optimized active layer and an optimized passive layer according to the embodiments of the present invention. As the TE mode comb and the TM mode comb coincide in their position on the graph, they are shown by dotted lines where each dotted line is to be understood to comprise a TE mode comb and a TM mode comb superposed on each other. The superposition may be obtained by fine tuning of the bias current of the birefringent passive section. Therefore, as a consequence of such superposition of the TE and TM combs, the FPLD becomes insensitive to the polarization of the injection locking optical signal.

Indeed the birefringence of the passive section can be used to compensate for the relative TE/TM mode positions of whole structure. However, such a compensation effect may in occasions be limited in the spectral range and temperature range. In case such limitation occurs, a look-up table may be measured and provided for the user for fine tuning of the device during its operation. Such a look-up table may contain a correspondence between the bias conditions (e.g. bias currents of the active section and that of the passive section IP) and the using conditions (e.g. temperature of the device and the actual locking wavelength).

Furthermore, in practice it may occur that the modulation of the PI gain section to code the uploading signal causes an index variation which may in turn cause a shift in the locking range of the modulated FPLD. As a result, the ONU may become unlocked from the locking signal, thus diminishing the locking margin of the sub-system (e.g. the IL-LD module integrated on an electronic card). This problem can be overcome by provisioning a third modulation section on the IL-LD device, which is devoted to modulation, and has a volume small enough to minimize carrier variation during modulation. Another solution may be that of providing an active material with a minimized phase-amplitude factor ($\alpha_H$), namely a factor value for $\alpha_H$ less than 2 so as to introduce minimal index variation during amplitude modulation. Still another solution may be that of using an off-cavity saturable absorber which can enhance the dynamic extinction ratio of the modulated signal, by absorbing optical power under its saturation power, and by letting the whole signal pass through when incoming optical power is higher than the saturation power, thus diminishing the need for large carrier density modulation inside the laser cavity.

It is to be noted that the gain material in the active section may also present a birefringent index value. However, by adjusting the bias current or voltage of the passive section, having a different birefringent index value, it becomes possible to compensate the overall TE/TM modes index difference of the whole structure.

The invention claimed is:

1. A method of manufacturing an injection-locked photonic device, comprising:

growing at least one first section and at least one second section, a material of the at least one first section being different from a material of the at least one second section such that said first and second sections present different optical birefringent index values, and such that in response to an injected optical signal the at least one first section and the at least one second section are configured to cause a first set of polarization modes associated with the at least one first section to move in a spectral space with a different velocity than a second set of polarization modes associated with the at least one second section, the injection-locked photonic device being configured such that in response to a biasing of the at least one first section and the at least one second section, the first set of polarization modes and the second set of polarization modes coincide in their respective spectral position.

2. The method of claim 1 wherein the photonic device is at least one of a (Fabry-Perot Laser Diode (FPLD), an optical filter, and an interferometer, and the method further comprises:

growing a polarization insensitive (PI) gain material in the first section, and growing a birefringence optimized passive material in the second section so that a total birefringence generated in a laser cavity is reduced to null.

3. A method of reducing sensitivity to polarization in an injection-locked photonic device including at least two sections, a first one of said at least two sections being of a different material than a second one of said at least two sections such that said at least two sections present different optical birefringent index values, and such that in response to an injected optical signal the first section and the second sections are configured to cause a first set of polarization modes to move in a spectral space with a different velocity than a second set of polarization modes, the method comprising:

biasing the first section with an electrical current configured to obtain an optical gain and biasing the second section with a current or a voltage configured to control a birefringence effect, said biasing of current or voltage for controlling the birefringence effect is such that TE (transverse electric) modes and TM (transverse magnetic) modes in the device are configured to coincide in their respective spectral positions.

4. The method of claim 3 wherein a look-up table containing a correspondence between bias conditions and using conditions is used to adjust the birefringence effect.

* * * * *